United States Patent
Bradbury et al.

(10) Patent No.: US 10,697,851 B2
(45) Date of Patent: *Jun. 30, 2020

(54) ELECTRO-MECHANICAL FUSE FOR DETECTING MONITORED COMPONENT DEFLECTION

(71) Applicant: International Business Machines Corporation, Armonk, NY (US)

(72) Inventors: Jonathan D. Bradbury, Poughkeepsie, NY (US); Jonathan R. Fry, Fishkill, NY (US); Michael R. Kane, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/720,861

(22) Filed: Sep. 29, 2017

(65) Prior Publication Data

US 2019/0101469 A1    Apr. 4, 2019

(51) Int. Cl.
| | |
|---|---|
| *G01M 5/00* | (2006.01) |
| *G01B 7/16* | (2006.01) |
| *G01R 31/28* | (2006.01) |
| *H05K 1/02* | (2006.01) |
| *G01L 1/06* | (2006.01) |

(52) U.S. Cl.
CPC ............ *G01M 5/0041* (2013.01); *G01B 7/16* (2013.01); *G01L 1/06* (2013.01); *G01M 5/0033* (2013.01); *G01M 5/0083* (2013.01); *G01R 31/2812* (2013.01); *H05K 1/0268* (2013.01)

(58) Field of Classification Search
CPC .... G01M 5/0041; G01M 5/0033; G01B 7/16; G01R 31/2812; G01L 1/06; H05K 1/0268
See application file for complete search history.

(56) References Cited

U.S. PATENT DOCUMENTS 5,184,517 A * 2/1993 Kelzer .................. G01L 5/0038
                                                            73/851
5,739,425 A    4/1998 Binnig et al.
(Continued)

FOREIGN PATENT DOCUMENTS

| | | |
|---|---|---|
| DE | 102014218974 A1 | 3/2016 |
| EP | 2546616 A1 | 1/2013 |

OTHER PUBLICATIONS

Anonymous, "Sensor Arrangement", 2015, IP.com Prior Art Database Technical Disclosure, 24 pages.
(Continued)

*Primary Examiner* — Peter J Macchiarolo
*Assistant Examiner* — John M Royston
(74) *Attorney, Agent, or Firm* — Cantor Colburn LLP; Teddi Maranzano (57) ABSTRACT

An electro-mechanical fuse is provided and includes a chassis component, an extrusion disposed on a monitored component which is disposable proximate to the chassis component and a sensor. The sensor is mounted to the chassis component. The sensor is mechanically breakable in power-on and power-off conditions by the extrusion as a result of a predefined action of or relative to the monitored component. The sensor electrically signals an occurrence of the mechanical breakage during power-on conditions following mechanical breakage.

19 Claims, 4 Drawing Sheets

(56) References Cited

U.S. PATENT DOCUMENTS

| | | | |
|---|---|---|---|
| 5,789,682 A * | 8/1998 | Dickinson | G01N 3/22 |
| | | | 257/E21.53 |
| 6,094,144 A | 7/2000 | Dishongh et al. | |
| 6,366,209 B2 | 4/2002 | Dishongh et al. | |
| 6,452,502 B1 | 9/2002 | Dishongh et al. | |
| 7,391,576 B2 | 6/2008 | Vigier-Blanc | |
| 7,621,190 B2 | 11/2009 | Ahmad et al. | |
| 7,655,269 B2 | 2/2010 | Mayer et al. | |
| 7,683,627 B2 | 3/2010 | Tsukuda | |
| 7,741,834 B2 | 6/2010 | Dang et al. | |
| 8,767,219 B2 | 7/2014 | Rutten | |
| 8,869,624 B2 * | 10/2014 | Schnetker | G01M 7/025 |
| | | | 73/577 |
| 9,086,267 B2 | 7/2015 | Ahmad et al. | |
| 2004/0129868 A1 | 7/2004 | Kilmartin | |
| 2006/0018029 A1 | 1/2006 | Vigier-Blanc | |
| 2012/0206735 A1 | 8/2012 | Rutten | |
| 2014/0013855 A1 | 1/2014 | Farahani et al. | |
| 2018/0047644 A1 | 2/2018 | Davis et al. | |

OTHER PUBLICATIONS

Elger et al., "Optical Leak Detection for Wafer Level Hermeticity Testing", 2004 IEEE/SEMI Int'l Electronics Manufacturing Technology Symposium, 6 pages.

List of IBM Patents or Patent Applications Treated as Related; (Appendix P), Filed Nov. 10, 2017, 2 pages.

Jonathan D. Bradbury et al., "Electro-Mechanical Fuse for Detecting Monitored Component Deflection", U.S. Appl. No. 15/809,064, filed Nov. 10, 2017.

* cited by examiner

ELECTRO-MECHANICAL FUSE FOR DETECTING MONITORED COMPONENT DEFLECTION

BACKGROUND

The disclosure relates generally to an electro-mechanical fuse that is configured to detect a predefined magnitude of deflection of a monitored component.

Defection, or the ability of a component to deflect, is a characteristic of components in many products for which there are specific critical tolerances. Therefore, the ability to detect cases where deflection tolerances have been exceeded can be important to maintaining a product as well as preventing unsafe conditions. As such, a device that is capable of detecting and recording occurrences of out of tolerance deflection is often needed to ensure quality and reliability of products.

SUMMARY

According to one or more embodiments, an electro-mechanical fuse is provided. The electro-mechanical fuse includes a chassis component, an extrusion that is disposed on a monitored component, which is disposable proximate to the chassis component, and a sensor. The sensor is mounted to the chassis component. The sensor is mechanically breakable in power-on and power-off conditions by the extrusion as a result of a predefined action of or relative to the monitored component. The sensor electrically signals an occurrence of the mechanical breakage during power-on conditions following mechanical breakage.

According to one or more embodiments, an electro-mechanical fuse is provided for identifying deflection of a monitored component. The electro-mechanical fuse includes a chassis component that includes a mounting, a conductor assembly that includes an encased conducting filament and circuitry. The circuitry is configured to identify encased conducting filament breakage. The encased conducting filament is supportively disposable on the mounting such that the encased conducting filament oppositely faces and is separate from the chassis component and the monitored component, respectively. The electro-mechanical fuse further includes an extrusion disposed on the monitored component to impact and then break the encased conducting filament upon a predefined action of or relative to the monitored component.

According to one or more embodiments, a method of operating an electro-mechanical fuse is provided for detecting a predefined action of or relative to a monitored component. The method includes disposing an extrusion on the monitored component with the monitored component proximate to a chassis component, mounting a sensor to the chassis component, configuring the sensor to be mechanically breakable in power-on and power-off conditions by the extrusion as a result of the predefined action of or relative to the monitored component and configuring the sensor to electrically signal an occurrence of the mechanical breakage during power-on conditions following the mechanical breakage.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated

DETAILED DESCRIPTION

In view of the above, embodiments disclosed herein may include an electro-mechanical fuse and a method and/or a computer program product for operating an electro-mechanical fuse for detecting a predefined action of or relative to a monitored component (e.g., a predefined magnitude of deflection of the monitored component). For purposes of clarity and brevity, the following description will relate to the case where the electro-mechanical fuse is configured for detecting a predefined magnitude of deflection of the monitored component.

Embodiments described herein are rooted in an electro-mechanical fuse and a method and/or a computer program product for operating an electro-mechanical fuse for detecting a predefined magnitude of deflection of a monitored component where excessive deflection of the monitored component results in an extrusion applying pressure to a body of the electro-mechanical fuse that eventually leads to cracking or breakage that opens up a sensor circuit. The embodiments provide for detection of out of tolerance deflections during power-on or power-off conditions where a signal that cracking or breakage has occurred is issued in response to sampling following power-on conditions taking effect. The electro-mechanical fuse is tailorable and low cost and replacement is inexpensive and can be performed with inspection or repair of the monitored component.

Figure 1:
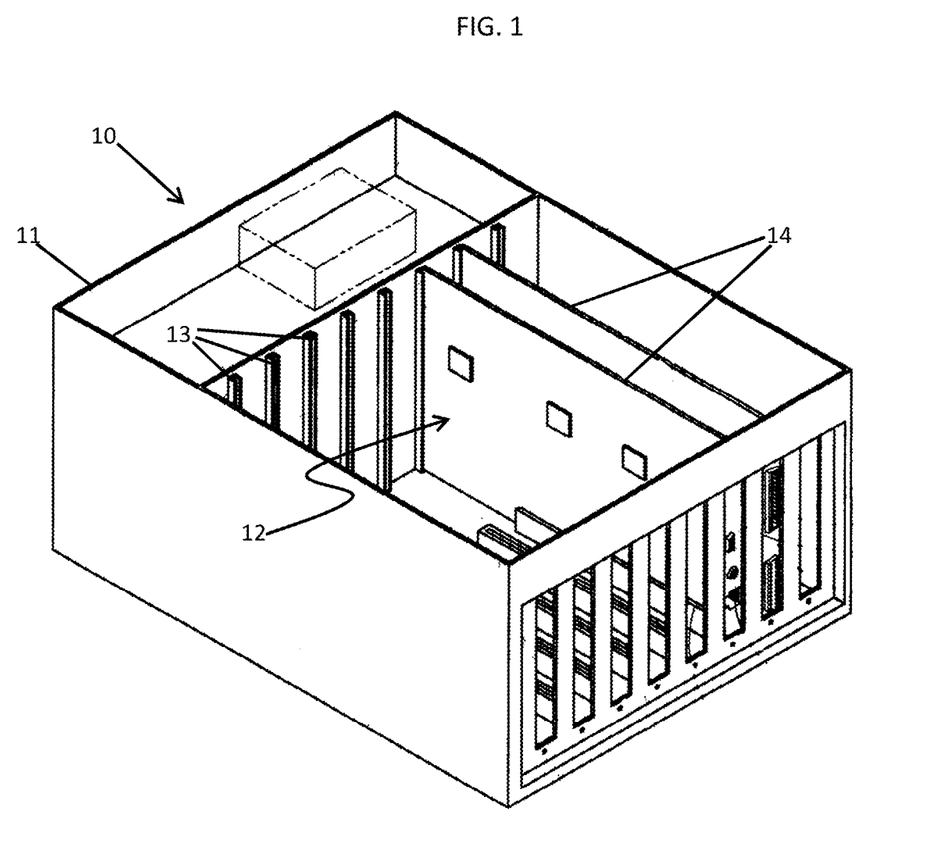
FIG. 1 is a perspective view of a computing device housing in accordance with embodiments.

Turning now to FIG. 1, a computing device housing 10 is provided for use in the assembly and operation of a computing device and includes a volumetric body 11 having a pair of opposite major surfaces (of which, one is missing or removed) and two pairs of opposite minor surfaces that define an interior 12. Within the interior 12, the computing device housing 10 accommodates various components including, but not limited to, slots 13 and cards or printed circuit boards (PCBs) 14. The PCBs 14 are insertable into the slots 13 in various configurations and arrangements to achieve a certain computing capability for the computing device. In the illustration of FIG. 1, two PCBs 14 are shown as having been inserted into two slots 13 but six additional slots 13 are available.

During transport, maintenance or repair of the computing device, external forces can be applied to the components mentioned above. For example, during a replacement or repair of one of the PCBs 14, an operator may insert his hand into the interior 12 and intentionally or unintentionally deflect the other PCB 14. Such deflection can either be within predefined tolerances or in excess of predefined tolerances. Where the deflection of the PCB 14 exceeds the predefined tolerances, the deflection can lead to damage or a shorting out of components on the deflected PCB 14. Thus, the deflection tolerances are typically established such that they are exceeded well before actual damage occurs.

In a conventional computing device, conventional sensors can be provided in order to detect the deflection of the PCB 14 (hereinafter referred to as a "monitored component") so that deflections which approach or exceed the predefined tolerances can be identified and, if necessary, addressed. The conventional sensors may include, for example, sacrificial sensors, strain gauges and accelerometers. The sacrificial sensors tend to require substantial real estate on the monitored component relative to the size of the monitored component. The strain gages typically provide for deflection sensing action but not hysteresis and thus need to be activated and currently reading in order to record a deflection. The accelerometers exhibit similar problems as the sacrificial sensors and the strain gauges.

As will be described herein, a sensor design is provided which is capable of detecting out-of-tolerance forces, torques or deflections in PCBs or other similar components and for other associated uses. The sensor design is tailorable for use in various environments and low cost.

Figure 2:
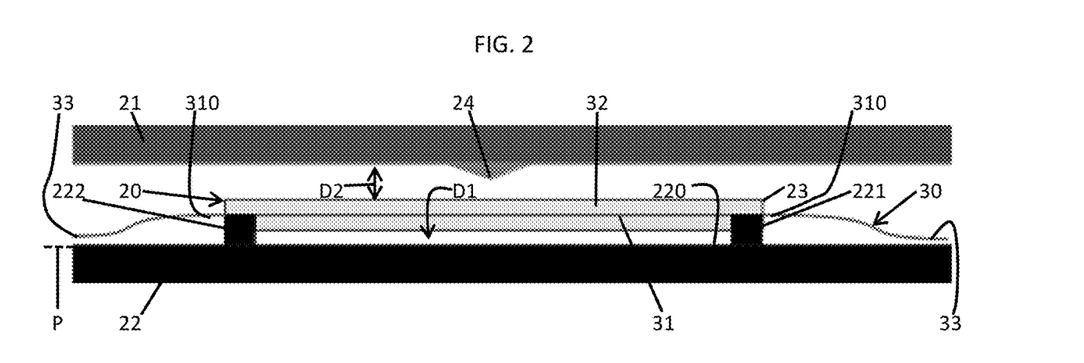
FIG. 2 is a side view of an electro-mechanical fuse for use with or in the computing device housing of FIG. 1 in accordance with embodiments.
Figure 3:
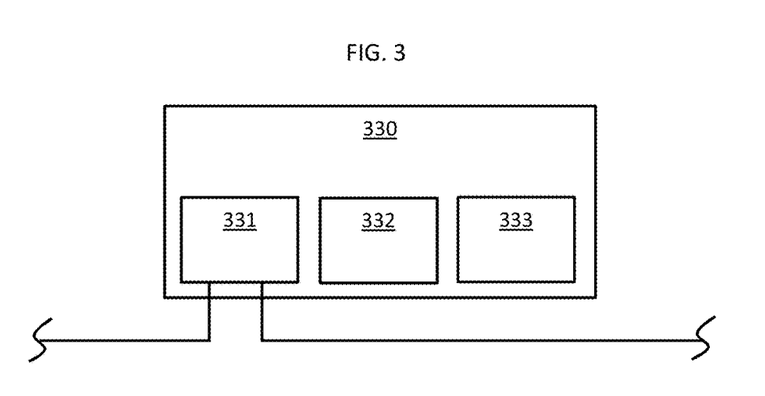
FIG. 3 is a schematic illustration of circuitry of the electro-mechanical fuse of FIG. 2 in accordance with embodiments.
Figure 4:
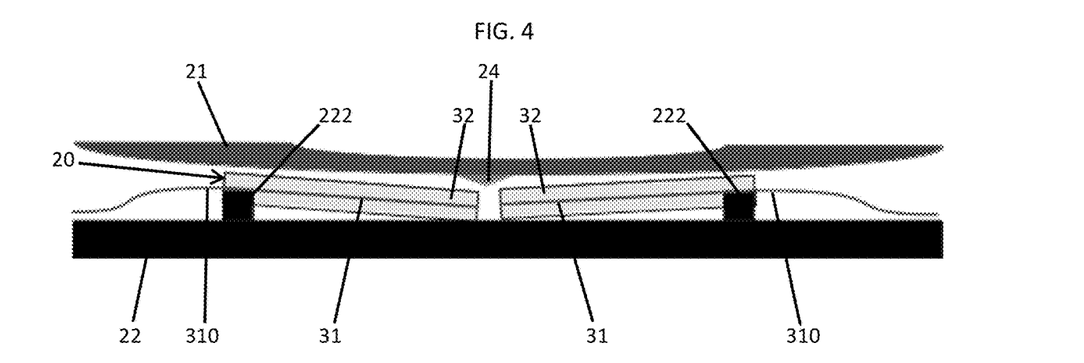
FIG. 4 is a side view of the electro-mechanical fuse of FIG. 2 following a breakage incident.

With reference to FIGS. 2-4, an electro-mechanical fuse 20 is provided. The electro-mechanical fuse 20 is configured in particular for identifying deflection of a monitored component 21 and especially for detecting out-of-tolerance deflections of the monitored component 21.

As shown in FIG. 2, the electro-mechanical fuse 20 includes a chassis component 22, a sensor 23 and one or more extrusions 24. The chassis component 22 may be provided as a fixed or unfixed and possibly rigid component of the computing device housing 10 of FIG. 1 and may include a wall portion or an internal structural feature of the computing device housing 10. In any case, the chassis component 22 is provided within the computing device housing 10 and includes a surface 220 and a mounting 221.

The surface 220 has a plane P which is substantially flat whereby a deflection of the monitored component 21 can be established and measured relative to the surface 220. The mounting 221, may be provided as one or more bosses 222 that protrude outwardly from the plane P of the surface 220. The sensor 23 is mounted on or by way of the mounting 221 to the chassis component 22. The sensor 23 is configured to be mechanically breakable in power-on and power-off conditions by the extrusion 24 as a result of a predefined magnitude of deflection of the monitored component 21 has occurred. The sensor 23 is further configured to electrically signal an occurrence of the mechanical breakage during power-on conditions or once power-on conditions take effect following the mechanical breakage. Such electronic signaling may be automatic or responsive to interrogation or sampling of the sensor 23.

In accordance with embodiments, the sensor 23 may include or be provided as a conductor assembly 30. The conductor assembly 30 includes a conducting filament 31, a body (hereinafter referred to as an "encasement") 32 for supporting or, more particularly, encasing a portion or length of the conducting filament 31 and circuitry 33 (see FIG. 3). The conducting filament 31 includes ends or leads 310 that are electrically communicative with the circuitry 33 whereby the circuitry 33 is configured to identify encased conducting filament breakage (i.e., a breakage of at least the conducting filament 31). The encasement 32 and the encased length of the conducting filament 31 are supportively disposable on the mounting 221 such that the encasement 32 and the encased length of the conducting filament 31 face and are separate from the surface 220 of the chassis component 22 in a first direction and face and are separate from the monitored component 21 in a second direction which is opposite the first direction.

As shown in FIG. 3, the circuitry 33 is connectable with the leads 310 and includes at least a processing circuit 330. The processing circuit 330 may include a processor 331, which is connectable with the conducting filament 31, a memory unit 332 and a networking unit 333 which provides for communications between the processor 331 and external devices. The memory unit 332 has executable instructions stored thereon for execution by the processor 331. When executed by the processor 331, the executable instructions cause the processor 331 to operate as described herein. For example, in a case where the encasement 32 and the encased length of the conducting filament 31 of the sensor 23 are mechanically broken by the extrusion during a power-off condition, the executable instructions may be configured to cause the processor to be receptive of a sampling signal from an external device upon power-up conditions taking effect, to then determine whether the circuitry 33 is open as a result of the mechanical breakage and to correspondingly electrically signal to the external device that an occurrence of the mechanical breakage has occurred at some point during the power-off conditions.

In accordance with embodiments, the determining of whether the circuitry 33 is open may be conducted by the processor 331 sending current into one side of the conducting filament 31 and reading whether the current is received at the other side of the conducting filament 31. If no current receipt is read, the processor 31 determines that the circuitry 33 is open and that the conducting filament 31 has been broken. The sending of the current into the one side of the conducting filament 31 may be conducted by the processor 331 periodically and/or in response to an interrogation or a sampling during power-on conditions. The sending of the current into the one side of the conducting filament 31 may be conducted by the processor 331 upon power-on conditions taking effect and/or in response to an interrogation or a sampling which occurs when power-on conditions take effect.

The distance D1 between the outer surface (chassis side) of the encasement 32 and the surface 220 of the chassis component 22 and the distance D2 between the outer surface (monitored component side) of the encasement 32 and the monitored component 21 are each established by the total distance between the monitored component 21 and the chassis component 22 and by the respective lengths of the one or more bosses 222 as measured from the plane P of the surface 220.

As shown in FIGS. 2 and 4, the extrusion 24 is disposed on the monitored component 21 to face and extend toward the chassis component 22 and to impact and then break the encasement 32 and the conducting filament 31 upon a predefined magnitude of deflection of the monitored component 21. That is, the total distance between the monitored component 21 and the chassis component 22 and the respective lengths of the one or more bosses 222 as measured from the plane P of the surface 220 may be set such that the extrusion 24 breaks the encasement 32 and the conducting filament 31 upon the predefined magnitude of deflection of the monitored component 21 with the predefined magnitude of deflection being set at or below the deflection tolerances for the monitored component 21. In this way, in an event the deflection of the monitored component 21 occurs such that mechanical breakage by the extrusion 24 also occurs, such mechanical breakage can and will be sensed by the sensor 23 so that mitigating actions can be taken if necessary.

In accordance with embodiments, the extrusion 24 may be formed of or may include materials that are harder than those of the conducting filament 31 and the encasement 32. In this way, a breakage-level impact between the extrusion and the encasement 32 will result in the mechanical breakage of the encasement 32 and not the extrusion 24.

In accordance with embodiments, the total distance between the monitored component 21 and the chassis component 22 and the respective lengths of the one or more bosses 222 as measured from the plane P of the surface 220 may be set or sized so as to provide for a clean mechanical breakage of the encasement 32 and the conducting filament 31 of the sensor 23. That is, in an event of an excessive deflection of the monitored component 21, the distance D1 will be sufficient for allowing a complete mechanical breakage of the encasement 32 and the conducting filament 31.

Figure 5:
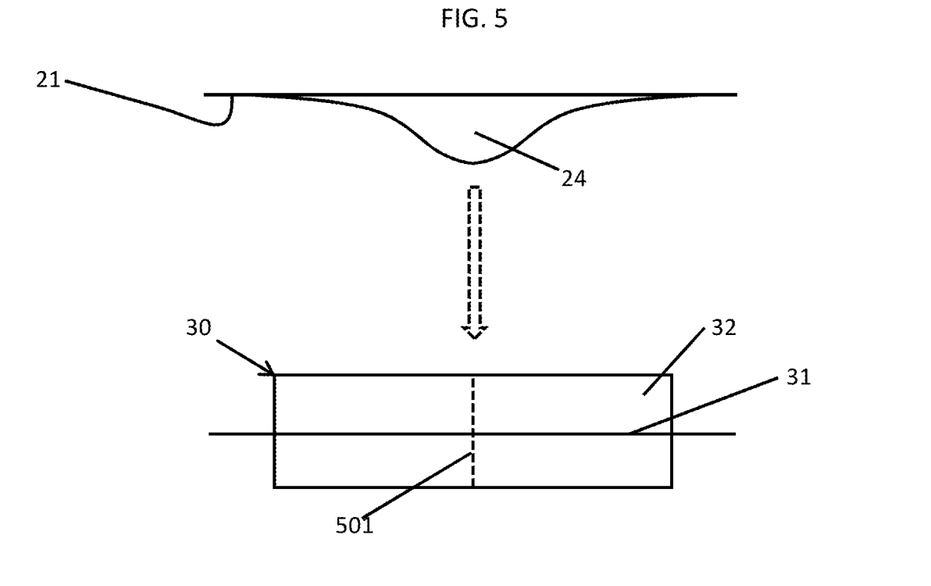
FIG. 5 is an enlarged view of components of the electro-mechanical fuse of FIGS. 2-4 in accordance with further embodiments.

In accordance with further embodiments and, with reference to FIG. 5, at least one or both of the conducting filament 31 and the encasement 32 may be made of brittle materials, such as a rigid conducting fiber in the case of the conducting filament 31 or glass in the case of the encasement 32, or laminate or composite materials having known break strengths which are known from empirical calculations relative to a prototype and are tuned or which are derived using known material properties (e.g., Young's modulus and stress curves for non-ductile materials). In addition, as shown in FIG. 5, at least one or both of the conducting filament 31 and the encasement 32 may be pre-cracked at a location 501 which corresponds to the projected impact location of the extrusion 24. This pre-cracking may facilitate or encourage an appropriate mechanical breakage of the conducting filament 31 and the encasement 32.

Figure 6:
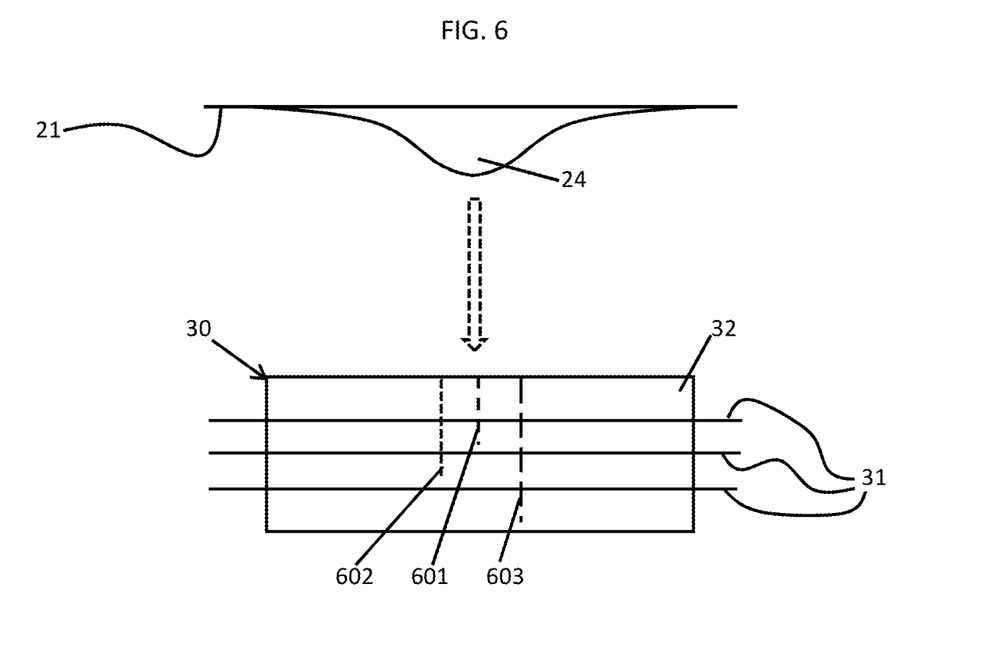
FIG. 6 is an enlarged view of components of the electro-mechanical fuse of FIGS. 2-4 in accordance with further embodiments.

In accordance with further embodiments and, with reference to FIG. 6, at least one or both of the conducting filament 31 and the encasement 32 may be configured for mechanical breakage in multiple stages 601, 602 and 603. Here, the stage 601 may correspond to a deflection of the monitored component 21 that is undesirable and an event to be sensed but not necessarily one that is associated with a damaging incident, the stage 602 may corresponding to a deflection of the monitored component 21 that is at or slightly in excess of the deflection tolerances and thus may be associated with damage requiring maintenance and the stage 603 may be associated with substantial deflection of the monitored component 21 that is likely to be associated with damage requiring replacement of the monitored component 21. In each case, the circuitry 33 may be configured to correspondingly electrically signal occurrences of the mechanical breakages in each of the multiple stages 601, 602 and 603.

Figure 7:
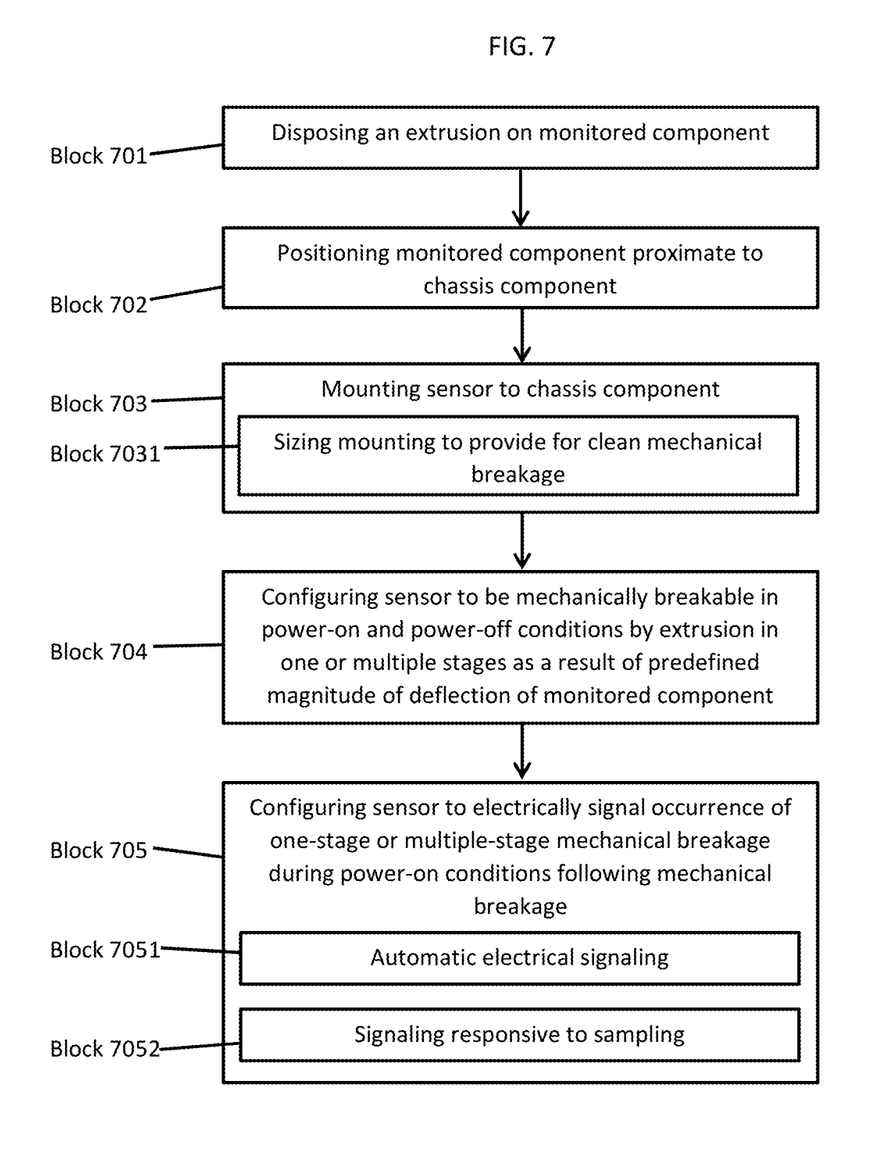
FIG. 7 is a flow diagram illustrating a method of operating an electro-mechanical fuse in accordance with embodiments.

With reference to FIG. 7, a method of operating an electro-mechanical fuse for detecting a predefined magnitude of deflection of a monitored component is provided. The method initially includes disposing an extrusion on the monitored component (block 701) and then positioning the monitored component proximate to a chassis component (block 702). The method also includes mounting a sensor to the chassis component (block 703) before, during or after the disposition of the extrusion and/or the positioning of the monitored component. The mounting may include, for example, sizing a mounting for the sensor to provide for clean mechanical breakage (block 7031). The method further includes configuring the sensor to be mechanically breakable in power-on and power-off conditions by the extrusion in one or multiple stages as a result of the predefined magnitude of deflection of the monitored component (block 704) and configuring the sensor to electrically signal an occurrence of the one-stage or multiple-stage mechanical breakage during power-on conditions following the mechanical breakage (block 705).

In accordance with embodiments and, as described above, the sensor may include a conductor assembly that in turn includes a conducting filament, an encasement to encase the conducting filament and circuitry. The circuitry is configured to identify the mechanical breakage at an instant of the mechanical breakage (if the mechanical breakage occurred during power-on conditions being in effect) or upon the power-on conditions taking effect (if the mechanical breakage occurred during power-off conditions being in effect). At least one of the conducting filament and the encasement are at least one of brittle and pre-cracked and the extrusion may be harder than at least the encasement.

In accordance with further embodiments and, as shown in FIG. 7, the method may also include configuring the sensor to automatically electrically signal the occurrence of the one-stage or multiple-stage mechanical breakage (block 7051) or to do so in response to an interrogation or sampling (block 7052).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electro-mechanical fuse, comprising:
a chassis component;
an extrusion disposed on a monitored component which is disposable proximate to the chassis component; and
a sensor mounted to the chassis component to be mechanically breakable in power-on and power-off conditions by the extrusion as a result of a predefined magnitude of deflection of the monitored component,
the sensor being configured to identify mechanical breakage of the conducting filament occurring during the power-off conditions and to electrically signal an occurrence of the mechanical breakage upon the power-on conditions taking effect following the mechanical breakage occurring during the power-off conditions.

2. The electro-mechanical fuse according to claim 1, wherein:
the chassis component is operably disposable within a computing device housing,
the chassis component comprises a surface and a mounting for the sensor, and
the mounting comprises bosses extending from the surface and which are sized for clean sensor breakage.

3. The electro-mechanical fuse according to claim 1, wherein the sensor comprises a conductor assembly comprising:
a conducting filament;
a body to support the conducting filament; and
circuitry configured to identify the mechanical breakage of the conducting filament occurring during the power-off conditions upon the power-on conditions taking effect.

4. The electro-mechanical fuse according to claim 3, wherein at least one of the conducting filament and the body are at least one of:
brittle,
comprised of laminates or composites with known break strengths, and
at least one of:
scored,
scribed,
pre-cracked, and
pre-stressed.

5. The electro-mechanical fuse according to claim 3, wherein the circuitry electrically signals the occurrence of the mechanical breakage occurring during the power-off conditions responsive to sampling upon the power-on conditions taking effect.

6. The electro-mechanical fuse according to claim 3, wherein the extrusion is harder than at least the body.

7. The electro-mechanical fuse according to claim 1, wherein the sensor is a singular element with multiple stages embodied therein and is configured to mechanically break in the multiple stages and to correspondingly electrically signal occurrences of the mechanical break in each of the multiple stages.

8. An electro-mechanical fuse for identifying deflection of a monitored component, the electro-mechanical fuse comprising:
a chassis component comprising a mounting;
a conductor assembly comprising an encased conducting filament and circuitry configured to identify encased conducting filament breakage,
the encased conducting filament being supportively disposable on the mounting such that the encased conducting filament oppositely faces and is separate from the chassis component and the monitored component, respectively; and
an extrusion disposed on the monitored component to impact and then break the encased conducting filament upon a predefined action of or relative to the monitored component,
wherein the circuitry is configured to identify the encased conducting filament breakage occurring during power-off conditions and to electrically signal an occurrence of the encased conducting filament breakage upon power-on conditions taking effect following the encased conducting filament breakage occurring during the power-off conditions.

9. The electro-mechanical fuse according to claim 8, wherein the chassis component is operably disposable within a computing device housing.

10. The electro-mechanical fuse according to claim 8, wherein the chassis component comprises a surface and the mounting comprises bosses extending from the surface which are sized for clean encased conducting filament breakage.

11. The electro-mechanical fuse according to claim 8 wherein the encased conducting filament comprises a conducting filament electrically communicative with the circuitry and a body supportive of the conducting filament.

12. The electro-mechanical fuse according to claim 11, wherein at least one of the conducting filament and the body are at least one of:
brittle,
comprised of laminates or composites with known break strengths, and
at least one of:
scored,
scribed,
pre-cracked, and
pre-stressed.

13. The electro-mechanical fuse according to claim 8, wherein the circuitry electrically signals the encased conducting filament breakage responsive to sampling upon the power-on conditions taking effect.

14. The electro-mechanical fuse according to claim 8, wherein the extrusion is harder than at least the encased conducting filament.

15. The electro-mechanical fuse according to claim 8, wherein:
the encased conducting filament is configured for breakage in multiple stages exclusively embodied in the encased conducting filament, and
the circuitry correspondingly electrically signals occurrences of the breakage of the encased conducting filament in each of the multiple stages.

16. An electro-mechanical fuse for identifying damage to a printed circuit board (PCB) inside a housing of a computing device, the electro-mechanical fuse comprising:
a chassis component of the housing, the PCB being disposed in the housing proximate to the chassis component;
an extrusion disposed on the PCB; and
a sensor mounted to the chassis component to be mechanically breakable in power-on conditions and power-off conditions by the extrusion as a result of the PCB deflecting by a predefined magnitude,
the sensor being configured to identify mechanical breakage of the conducting filament occurring during the power-off conditions by mechanically breaking during the power-off conditions and to electrically signal an occurrence of the mechanical breakage upon the power-on conditions taking effect following the mechanical breakage occurring during the power-off conditions.

17. The electro-mechanical fuse according to claim 16, wherein the sensor comprises a conductor assembly comprising:
- a conducting filament;
- a body to support the conducting filament; and
- circuitry configured to identify the mechanical breakage of the conducting filament occurring during the power-off conditions upon the power-on conditions taking effect.

18. The electro-mechanical fuse according to claim 17, wherein the circuitry electrically signals the occurrence of the mechanical breakage occurring during the power-off conditions responsive to sampling upon the power-on conditions taking effect.

19. The electro-mechanical fuse according to claim 16, wherein the sensor is a singular element with multiple stages embodied therein and is configured to mechanically break in the multiple stages and to correspondingly electrically signal occurrences of the mechanical break in each of the multiple stages.

* * * * *